(12) United States Patent
Hou et al.

(10) Patent No.: US 11,404,128 B2
(45) Date of Patent: Aug. 2, 2022

(54) POWER CONTROL METHOD FOR A MEMORY STORAGE DEVICE AND A MEMORY STORAGE SYSTEM

(71) Applicant: Acer Incorporated, New Taipei (TW)

(72) Inventors: Guan-Yu Hou, New Taipei (TW);
Tz-Yu Fu, New Taipei (TW);
Chun-Chih Kuo, New Taipei (TW);
Ming Feng Hsieh, New Taipei (TW)

(73) Assignee: ACER INCORPORATED, New Taipei (TW)

( * ) Notice: Subject to any disclaimer, the term of this patent is extended or adjusted under 35 U.S.C. 154(b) by 0 days.

(21) Appl. No.: 17/020,887

(22) Filed: Sep. 15, 2020

(65) Prior Publication Data
US 2021/0391022 A1 Dec. 16, 2021

(30) Foreign Application Priority Data
Jun. 12, 2020 (TW) .................. 109119959

(51) Int. Cl.
G11C 16/30 (2006.01)
(52) U.S. Cl.
CPC ................... G11C 16/30 (2013.01)

(58) Field of Classification Search
CPC ..................................................... G11C 16/30
See application file for complete search history.

(56) References Cited

U.S. PATENT DOCUMENTS

| 2011/0004778 | A1 | 1/2011 | Tsukamoto et al. |
| 2014/0226400 | A1 | 8/2014 | Kimura |
| 2019/0113956 | A1* | 4/2019 | Hung ................... G06F 1/3206 |

OTHER PUBLICATIONS

TW Search Report, 109119959, dated Aug. 17, 2021, 1 page.
TW Office Action, 11020798420, dated Aug. 17, 2021, 4 pages.

* cited by examiner

Primary Examiner — Jay W. Radke
(74) Attorney, Agent, or Firm — Edell, Shapiro & Finnan, LLC

(57) ABSTRACT

A power control method for a memory storage device and a memory storage system are provided. The method includes configuring a power controller in a host system, controlling, by the power controller, a power gate disposed between the host system and the memory storage device, and controlling a power supply of the memory storage device from the host system by the power gate, wherein the power gate is not controlled by a Basic Input Output System (BIOS) controller of the host system.

17 Claims, 3 Drawing Sheets

POWER CONTROL METHOD FOR A MEMORY STORAGE DEVICE AND A MEMORY STORAGE SYSTEM

This application claims the benefit of Taiwan Application Serial No. 109119959, filed Jun. 12, 2020, the subject matter of which is incorporated herein by reference.

TECHNICAL FIELD

The invention is related to storage device power control, and more particularly to a storage/memory power control method and storage/memory system.

BACKGROUND

Non-Volatile Memory (NVM) Express (NVMe) or Non-Volatile Memory Host Controller Interface Specification (NVMHCIS) are open logical device interface specifications for accessing non-volatile storage media attached via a PCI Express (PCIe) bus. Compared to using, for example, a SATA device, using NVMe to communicate with host system memory has higher data access performance.

To achieve a conventional standby power state, an NVMe storage device will enter power state four (PS4) to cause its standby power consumption to drop dramatically. However, some types of NVMe devices may incorporate ACPI (Advanced Configuration and Power Interface) and thus may be operated under the D1 (operation mode) state and D3 (low power mode) state. As is known in the art, the power consumption in the D3 state is lower than in the D1 state. And, as is further known, the D3 state can be further subdivided into the D3-cold and D3-hot states. For the D3-cold state, a host system will cut off NVMe power supply, and for the D3-hot state, the host system will cut off most of the NVMe power supply, but will maintain some registry power in order to enable faster wake up.

FIG. 1 shows a generic NVMe storage system architecture according to the prior art. As shown, an NVMe storage system 10 includes a host system 11 and a memory storage device 12. Host system 11 includes a processor 111, a storage controller 112, a power gate 113, BIOS controller 114, and an embedded controller 120. When the processor 111 receives a standby power command, processor 111 will cause BIOS controller 114 to control power gate 113, via embedded controller 120, to cut off the power to memory storage device 12 that is delivered from host system 11. Processor 111 will also cause storage controller 112 to send a D3-cold command to memory storage device 12, so that the memory storage device 12 will perform power cut-off operations including, e.g., performing data backup for a memory buffer.

Notably, according to FIG. 1, BIOS controller 114 is responsible (via embedded controller 120) for causing power cut-off for the memory storage device 12, and the internal power cut-off of memory storage device 12 is independent as a result of the command from storage controller 112. Given that arrangement, if BIOS controller 114 cuts off power to memory storage device 12 too early, memory storage device 12 may unexpectedly power-off too soon, which may be considered an "unsafe shutdown." Moreover, after memory storage device 12 enters the D3-cold state, BIOS controller 114 may nevertheless power-off/power-on memory storage device 12 without any prior notification as a result of, e.g., a trigger from a separate hardware (e.g., network interface) status update. Such behavior will cause memory storage device 12 to frequently power cycle, thus leading to multiple unsafe shutdowns, which can cause storage data integrity and safety concerns.

SUMMARY

Embodiments of the present invention provide a power control method for a memory storage device and for a memory storage system that can reduce occurrences of memory storage device unsafe shutdowns.

In one embodiment, the invention provides a power control method for a memory storage device, including configuring a power controller in a host system and using a power gate to control the power between the host system and the memory storage device. Notably, the power gate is not controlled by the BIOS controller of the host system, but is instead controlled by the separate power controller.

Another embodiment of the invention provides a memory storage system that contains a host system and memory storage device. The host system contains a power controller, a power gate and a BIOS controller. The memory storage device is communicatively coupled with the host system, the power controller is used to control the power gate, and the power gate is used to control power delivered to the memory storage device from the host system. Notably, the power gate is not controlled by the BIOS controller of the host system, but is instead controlled by the separate power controller.

In yet another embodiment, the host system can configure a separate power controller. The separate power controller can control power between the host system and the memory storage device via a power gate. And, as in the other embodiments, the power gate is not controlled by the BIOS controller of the host system, but is instead controlled by the separate power controller.

The disclosed embodiments can reduce unsafe shutdown occurrences of the memory storage device.

BRIEF DESCRIPTION OF THE DRAWINGS

Embodiments are described herein in conjunction with the accompanying drawings, in which.

DESCRIPTION OF EXAMPLE EMBODIMENTS

Figure 2:
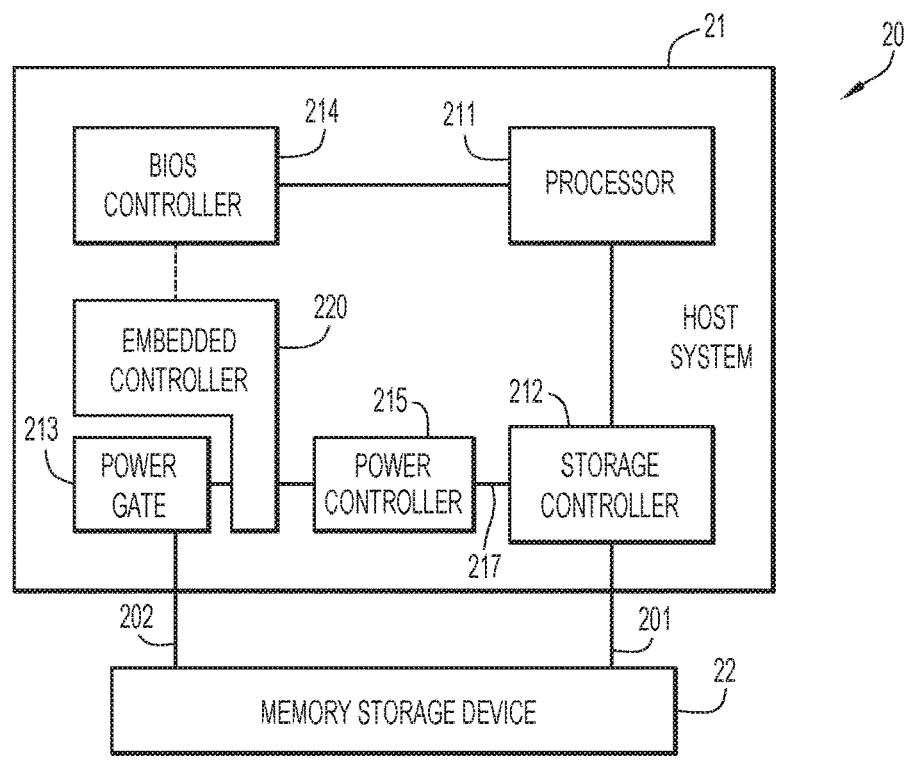
FIG. 2 shows a functional block diagram of a memory storage system according to an example embodiment.

FIG. 2 shows a functional block diagram of a memory storage system according to an example embodiment. The memory storage system 20 includes a host system 21 and a memory storage device 22. The interface specification between host system 21 and memory storage device 22 may operate in accordance with, e.g., the NVMe interface specification(s). Memory storage system 20 may also be referred to as an "NVMe storage system."

Host system 21 is communicatively coupled with memory storage device 22 and is configured to store data to memory storage device 22 or to read data from memory storage device 22. For example, host system 21 may directly communicate with and access memory storage device 22, which may be a computer system, digital camera, camera, communication device, audio player, video player, or tablet, etc. Memory storage device 22 may also be a USB flash memory, memory card, SSD (Solid State Drive), SD (Secure Digital) card, CF (Compact Flash) card, or embedded storage device, etc.

Host system 21 includes processor 211, storage controller 212, power gate 213, BIOS controller 214, and embedded controller 220. Processor 211 is used to control storage controller 212 and BIOS controller 214. For example, processor 211 can be a CPU (Central Processing Unit) or a programmable microprocessor, DSP (Digital Signal Processor), programmable controller, ASIC (Application Specific Integrated Circuit), or PLD (Programmable Logic Device), etc. In addition, processor 211 may run an operating system and may be responsible for part, or all, of the operation of host system 21.

Storage controller 212 is communicatively coupled to processor 211 and is configured to control memory storage device 22. Processor 211 can access memory storage device 22 or communicate with memory storage device 22 through storage controller 212. For example, storage controller 212 can communicate with memory storage device 22 via bus or command/data path 201. Storage controller 212 may be implemented as software code or hardware, or a combination thereof.

Power gate 213 is communicatively coupled with storage controller 212, via, e.g., embedded controller 220, and is configured to provide electric power to memory storage device 22. For example, power gate 213 may be disposed between host system 21 and memory storage device 22, and may include a hardware component such as a switch.

Figure 1:
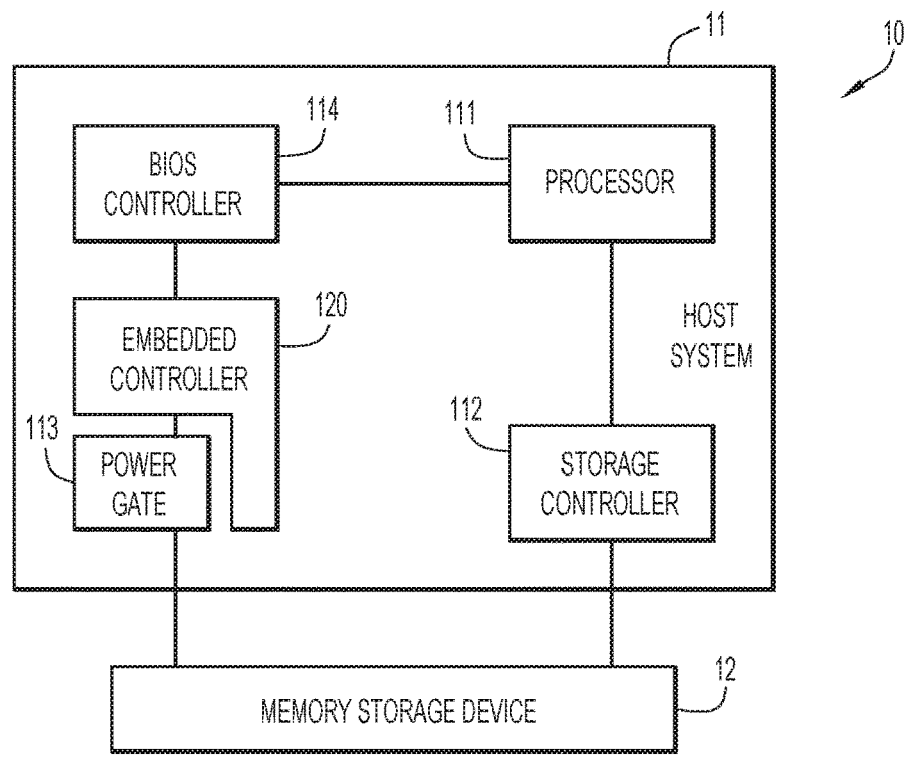
FIG. 1 shows an NVMe storage system architecture according to the prior art.

BIOS controller 214 is communicatively coupled to processor 211 and can, according to processor 211's indication, execute interface control. It should be noted that in a traditional power control architecture (like that shown in FIG. 1) BIOS controller 114 is configured to control power gate 113 to control whether power is provided to memory storage device 12 or not. However, in accordance with the embodiments described herein, power gate 213 is not controlled by BIOS controller 214.

Rather, in accordance with one implementation, a power controller 215 is configured on host system 21. Power controller 215, which is configured to monitor aspects of storage controller operations via, e.g., connection 217, can be used to control power gate 213 to control whether or not to provide power to memory storage device 22. In a case where BIOS controller 214 is used to control the power gate 213 to control whether to provide power to the memory storage device 22 or not then, in another possible implementation, embedded controller 220 may be configured to allow power controller 215 to override BIOS controller 214 and control power gate 213. Embedded control 220 may also be configured to disable the ability of BIOS controller 214 to control power gate 213. Like storage controller 212, power controller 215 may be implemented as software code or hardware, or a combination thereof.

Memory storage device 22 includes at least one memory controller (which may also be referred to as a flash memory controller) and at least one non-volatile memory module. The memory controller(s) can be used to control the non-volatile memory module(s). The non-volatile memory module(s) may include one or more of a SLC (single level cell) NAND flash memory module, MLC (multi-level cell) NAND flash memory module, TLC (triple level cell) NAND flash memory module, or QLC (quad level cell) NAND flash memory module. In general, memory storage device 22 may also be referred to as an NVMe storage device.

Figure 3:
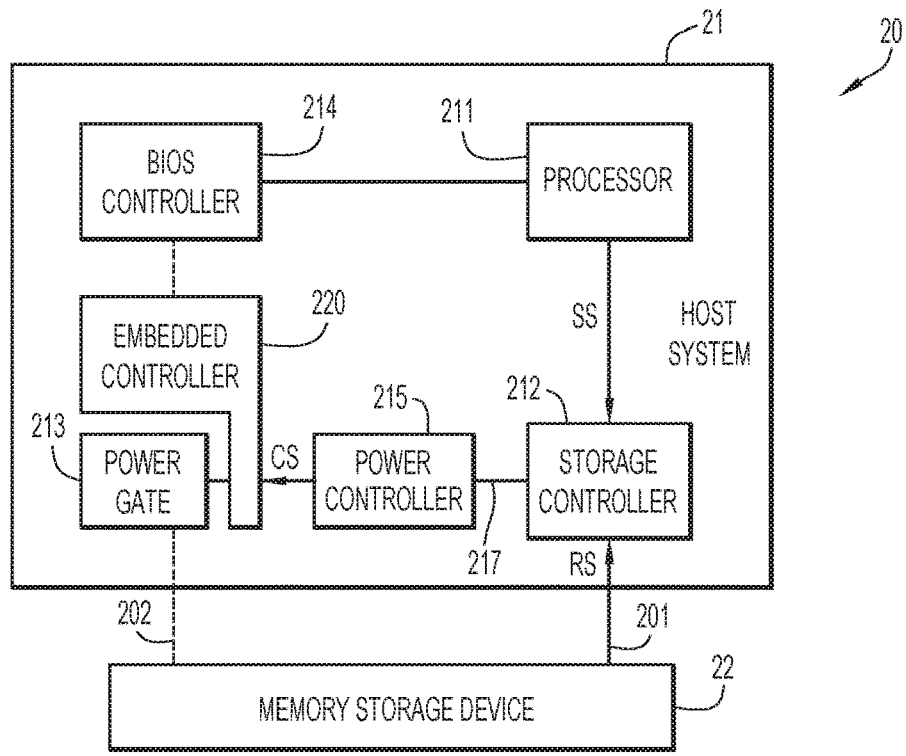
FIG. 3 shows a functional block diagram depicting cutting off the power supply from the host system to the memory storage device according to an example embodiment.

FIG. 3 shows a functional block diagram depicting cutting off the power supply from the host system to a memory storage device according to an example embodiment. More specifically, when processor 211 detects memory storage device 22 shutdown or a command to enter D3-cold, processor 211 can issue a power cut off signal SS to storage controller 212, and power controller 215 detects the same. In response to the power cut off signal SS, power controller 215 can issue a control signal CS to power gate 213 to indicate to power gate 213 to cut off power delivered by host system 21 to memory storage device 22.

That is, in response to the power cut off signal SS, storage controller 212 can indicate, via bus 201, to memory storage device 22 to perform a power cut off operation and then wait for memory storage device 22 to complete the power cut off operation. For example, in a power off operation, memory storage device 22 can back up data of a volatile memory module to a non-volatile memory module in order to avoid data loss after power off. After the data backup operation is complete, memory storage device 22 can return a shutdown ready signal RS to or storage controller 212. Shutdown ready signal RS indicates that the memory storage device 22 has completed powering off and it is thus in a state where it can be powered off normally or safely.

In response to the power off completed signal RS, power controller 215 can issue a control signal CS with a power off command to power gate 213, and thus control power gate 213 to cut off the power from host system 21 to memory storage device 22. For example, in response to control signal CS with a cut power command, power gate 213 can cut off line 202 to terminate power provided to memory storage device 22, as shown in FIG. 3.

It should be noted that since power controller 215 controls power gate 213 to cut off the power supply of host system 21 to memory storage device 22 only after detecting receipt of the power cut off completed signal RS, it is ensured that memory storage device 22 is powered off at a time when it is more preferable to be powered off. Compared to the traditional control of the power supply to the memory storage device (such as memory storage device 12) by a BIOS controller (such as BIOS controller 114), replacing the function of the BIOS controller with power controller 215 to control power gate 213 can effectively reduce the probability of unsafe shutdown of memory storage device 22.

Figure 4:
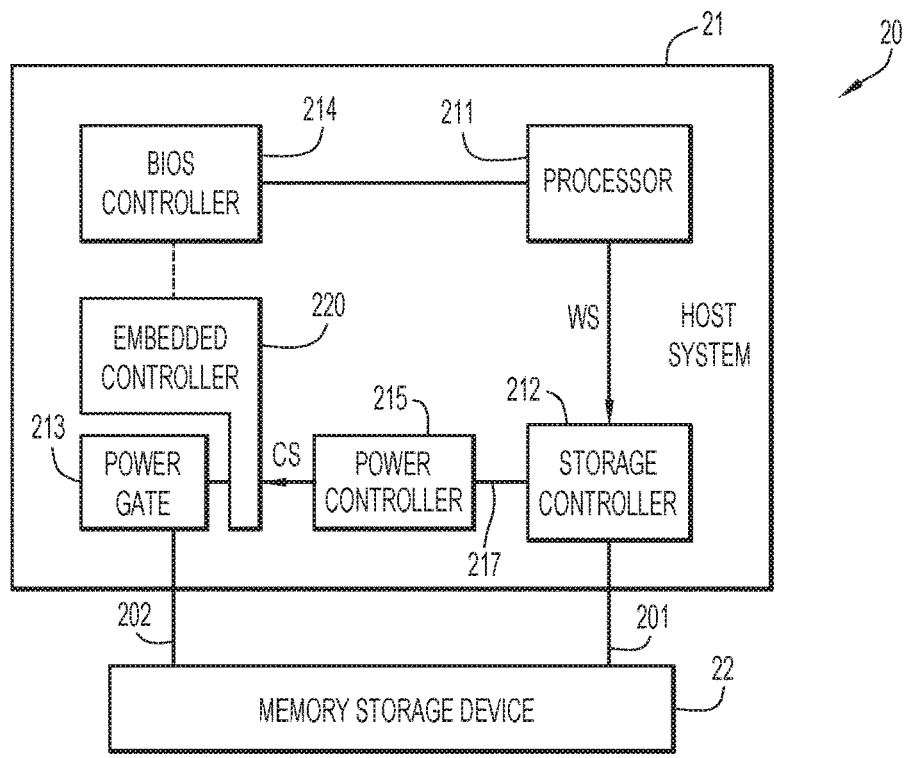
FIG. 4 shows a functional block diagram depicting restoring the power supply from the host system to the memory storage device according to an example embodiment.

FIG. 4 shows a functional block diagram depicting restoring the power supply from the host system to the memory storage device according to an example embodiment. Specifically, suppose the current memory storage device 22 is in shutdown or a D3-cold state, or some other unpowered state. When processor 211 detects a command to wake up memory storage device 22 from host system 21, processor 211 can issue a wake up signal WS to storage controller 212. In response to detecting the wake up signal WS, power controller 215 can issue control signal CS to power gate 213, in order to instruct power gate 213 to restore power from host system 21 to memory storage 22. For example, in response to the control signal CS with a restore power command, power gate 213 can restore line 202 to re-provide power to memory storage device 22.

It should be noted that, in the prior art, power restoration is controlled by a BIOS controller (e.g., BIOS controller 114) controlling power gate 113 to restore power to a memory storage device (e.g., memory storage device 11). Therefore, BIOS controller 114 may directly cause restoration of power to memory storage device 11 without first notifying the memory storage device 11 (as a result of, e.g., an update from a software or hardware interface (such as a network interface), etc.), thus potentially causing the memory storage device 12 to perform unsafe power up. However, in the example embodiment of FIG. 4, the power controller 215 replaces the BIOS controller (for example, the BIOS controller 214) to perform power-recovery control on the power gate 213. This ensures that processor 211 first detects a command to actually wake up the memory storage device 22 before the power the controller 215 controls the power gate 213 to restore power to the memory storage device 22, thereby effectively reducing the probability of unsafe powering up of the memory storage device 22.

In a preferred embodiment, processor 211 may also actively disable the BIOS controller 214 from controlling the power gate 213. For example, disabling the control of power gate 213 by BIOS controller 214 may include stopping or turning off the control authority of BIOS controller 214 to power gate 213, via, e.g., embedded controller 220, so that BIOS controller 214 cannot control power gate 213. As a result, even if BIOS controller 214 supports the control of power gate 213 by default, after BIOS controller 214 is disabled from controlling power gate 213, BIOS controller 214 immediately loses the ability to control power gate 213. Instead of BIOS controller performing power off/reset control of power gate 231, power controller 215 is configured to perform power off/reset control of power gate 213, thereby reducing the probability of unsafe power failure or cycling of memory storage device 22.

Figure 5:
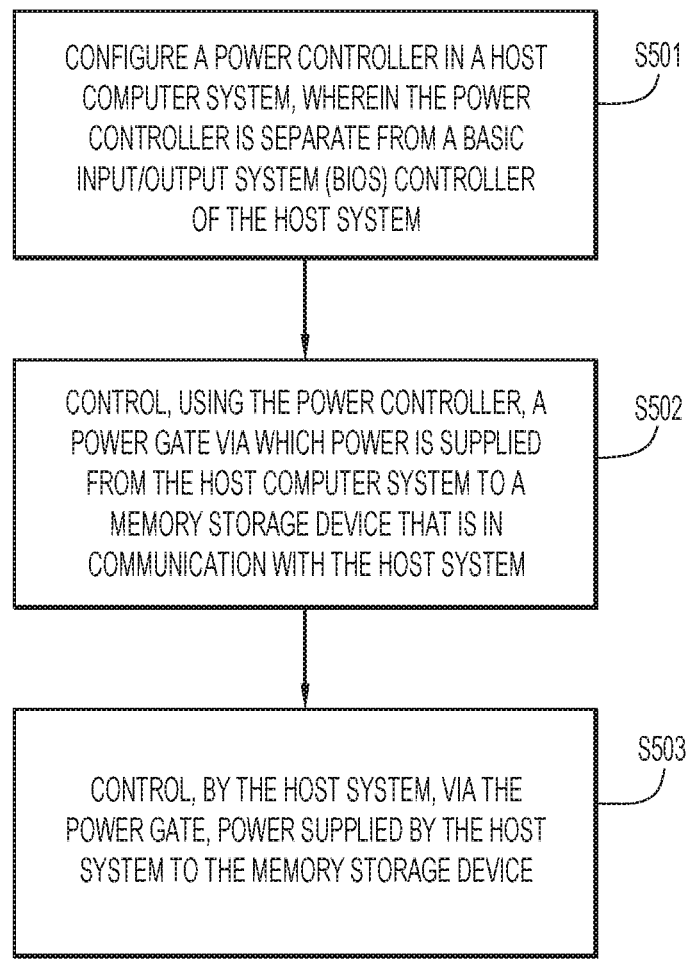
FIG. 5 is a flow chart of a series of operations of a power supply control method for a memory storage device according to an example embodiment.

FIG. 5 depicts a flow chart of a series of operations of a power supply control method for a memory storage device according to an example embodiment. At step S501, a power controller is configured in the host system, wherein the power controller is separate from a basic input/output system (BIOS) controller of the host system. At step S502, the power controller controls a power gate via which power is supplied from the host system to a memory storage device that is in communication with the host system. At step S503, the power supply of the memory storage device is controlled by the host system via the power gate. Notably, the power gate is not controlled by the BIOS controller of the host system.

Those skilled in the art will appreciate that the steps depicted in FIG. 5 can be implemented as software or hardware, or a combination thereof. In addition, the method outlined in FIG. 5 can be applied in connection with the preferred embodiments described herein, or with different implementations.

In summary, the preferred embodiments of the present invention propose to configure a separate power controller in the host system. The main purpose of the power controller is to integrate the communication capabilities of the storage controller and the memory storage device and replace the traditional control of the power gate by a BIOS controller. Before powering off the memory storage device, the power controller can ensure that the memory storage device has completed power-off routines. Before power is restored to the memory storage device, the power controller can ensure the correctness of the power restoration behavior. Consequently, the occurrence of unsafe powering off of the memory storage device and/or the instability of the memory storage device with respect to power supply can be effectively reduced.

The above description is intended by way of example only.

What is claimed is:

1. A method comprising:
   configuring a power controller in a host system, the power controller being responsive to signaling sent to a storage controller that controls a memory storage device that is in communication with the host system;
   controlling, using the power controller, a power gate via which power is supplied from the host system to the memory storage device; and
   controlling, by the host system, via the power gate, power supplied by the host system to the memory storage device,
   wherein the power controller controls the power gate via an embedded controller of the host system.

2. The method of claim 1, further comprising the power controller overriding a control command sent by a basic input/output system (BIOS) controller, via the embedded controller, to control the power gate.

3. The method of claim 1, wherein the host system includes a processor, the processor sending a power cut off command to the storage controller to cut off power to the memory storage device and, in response to detecting the power cut off command, the power controller sending a control signal to the power gate to cut off power to the memory storage device.

4. The method of claim 3, further comprising the power controller sending the control signal to the power gate to cut off power to the memory storage device only after the storage controller receives a shutdown ready signal from the memory storage device.

5. The method of claim 3, further comprising the processor sending a wake up signal to the storage controller and, in response to detecting the wake up signal, the power controller sending a restore power signal to the power gate to restore power to the memory storage device.

6. The method of claim 1, wherein the memory storage device is a non-volatile memory express (NVMe) memory storage device.

7. The method of claim 1, wherein the memory storage device comprises at least one of a USB (Universal Serial Bus) flash memory, memory card, SSD (Solid State Drive), SD (Secure Digital) card, CF (Compact Flash) card, or embedded storage device.

8. The method of claim 1, wherein the memory storage device is operational in at least two different low power mode states.

9. A memory storage system comprising:
   a host system including a storage controller, a power controller, and a power gate; and
   a memory storage device in communication with the host system and powered by the host system via the power gate,
   wherein the power controller, responsive to signaling sent to the storage controller, controls the power gate to enable the host system to provide power to the memory storage device, and
   wherein the power controller controls the power gate via an embedded controller of the host system.

10. The memory storage system of claim 9, wherein the embedded controller is configured to override a control command sent by a basic input/output system (BIOS) controller to control the power gate, and instead enable the power controller to control the power gate.

11. The memory storage system of claim 9, wherein the host system includes a processor, and the processor is configured to send a power cut off command to the storage controller to cut off power to the memory storage device and, in response to detecting the power cut off command, the power controller is configured to send a control signal to the power gate to cut off power to the memory storage device.

12. The memory storage system of claim 11, wherein the power controller is configured to send the control signal to the power gate to cut off power to the memory storage device only after the storage controller receives a shutdown ready signal from the memory storage device.

13. The memory storage system of claim 11, wherein the processor is configured to send a wake up signal to the storage controller and, in response to detecting the wake up signal, the power controller is configured to send a restore power signal to the power gate to restore power to the memory storage device.

14. The memory storage system of claim 9, wherein the memory storage device is a non-volatile memory express (NVMe) memory storage device.

15. The memory storage system of claim 9, wherein the memory storage device comprises at least one of a USB (Universal Serial Bus) flash memory, memory card, SSD (Solid State Drive), SD (Secure Digital) card, CF (Compact Flash) card, or embedded storage device.

16. The memory storage system of claim 9, wherein the memory storage device is operational in at least two different low power mode states.

17. A memory storage system comprising:
a host system including a processor, a storage controller, a power controller, and a power gate; and
a memory storage device in communication with the host system and powered by the host system via the power gate,
wherein the power controller, responsive to at least one of signaling from the processor to the storage controller and signaling from the memory storage device to the storage controller, controls the power gate to enable the host system to provide power to the memory storage device, and
wherein the signaling from the processor to the storage controller comprises a signal indicative of command to shut off power, and the signaling from the memory storage device to the storage controller comprises a signal indicative of a command indicating the memory storage device is ready to have power shut off.

* * * * *